United States Patent
Ackerson et al.

(10) Patent No.: US 8,618,588 B2
(45) Date of Patent: Dec. 31, 2013

(54) ANTI-BLOOMING PIXEL SENSOR CELL WITH ACTIVE NEUTRAL DENSITY FILTER, METHODS OF MANUFACTURE, AND DESIGN STRUCTURE

(75) Inventors: Kristin M. Ackerson, Colchester, VT (US); Jeffrey P. Gambino, Westford, VT (US); Mark D. Jaffe, Shelburne, VT (US); Robert K. Leidy, Burlington, VT (US); Richard J. Rassel, Colchester, VT (US); Robert M. Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 363 days.

(21) Appl. No.: 12/915,888

(22) Filed: Oct. 29, 2010

(65) Prior Publication Data

US 2012/0105692 A1   May 3, 2012

(51) Int. Cl.
 *H01L 31/062* (2012.01)
 *H01L 31/113* (2006.01)

(52) U.S. Cl.
 USPC .............. 257/292; 257/E31.127; 348/296

(58) Field of Classification Search
 USPC ............ 257/292, E31.127; 348/296; 716/103
 See application file for complete search history.

(56) References Cited

U.S. PATENT DOCUMENTS

| | | | |
|---|---|---|---|
| 5,070,380 A | 12/1991 | Erhardt et al. | |
| 5,608,243 A | 3/1997 | Chi et al. | |
| 6,426,492 B1 | 7/2002 | Bos et al. | |
| 6,621,616 B1 | 9/2003 | Bauer et al. | |
| 6,635,857 B1* | 10/2003 | Kindt | 250/208.1 |
| 6,690,049 B2 | 2/2004 | Suzuki et al. | |
| 6,963,437 B2 | 11/2005 | Bauer et al. | |
| 7,586,139 B2 | 9/2009 | Adkisson et al. | |
| 7,598,478 B2* | 10/2009 | Morimoto et al. | 250/208.1 |
| 2004/0135916 A1 | 7/2004 | Makii | |
| 2006/0266922 A1 | 11/2006 | McGrath et al. | |
| 2007/0152292 A1 | 7/2007 | Toros et al. | |
| 2008/0237450 A1 | 10/2008 | Abadeer | |
| 2009/0303366 A1 | 12/2009 | Gambino et al. | |
| 2009/0309143 A1 | 12/2009 | Adkisson et al. | |
| 2010/0013973 A1 | 1/2010 | Adkisson et al. | |

FOREIGN PATENT DOCUMENTS

| | | | | |
|---|---|---|---|---|
| JP | 02-089377 | * | 3/1990 | ............ H01L 31/10 |
| JP | 9129859 | | 5/1997 | |

OTHER PUBLICATIONS

A. Chen, "New Photochromic Material Could Advance Energy-Efficient Windows", http://www.lbl.gov/Science-Articles/Archive/cheap-photochromics.html, Aug. 25, 1998, pp. 1-3.
"How Electrochromic Windows Work", http://www.nrel.gov/buildings/windows/how.html, Electrochromic Windows Research, 2006, pp. 1-2.
"Advanced Prototypes for Electrochromic Windows", http://www.nrel.gov/buildings/prototypes.html, Electrochromic Windows Research, 2005, pp. 1-4.
Bonsor, "How Smart Windows Work", http://tlc.howstuffworks.com/home/smart-window.htm/printable, Jun. 9, 2010; 13 pages.

* cited by examiner

*Primary Examiner* — Howard Weiss

(74) *Attorney, Agent, or Firm* — Anthony Canale; Roberts Mlotkowski Safran & Cole, P.C.

(57) ABSTRACT

A method of preventing blooming in a pixel array includes affecting an amount of light that impinges on a photoelectric conversion element by adjusting a transmissivity of an electrochromic element based on an output of the photoelectric conversion element.

20 Claims, 8 Drawing Sheets

US 8,618,588 B2

ANTI-BLOOMING PIXEL SENSOR CELL WITH ACTIVE NEUTRAL DENSITY FILTER, METHODS OF MANUFACTURE, AND DESIGN STRUCTURE

FIELD OF THE INVENTION

The invention relates to semiconductor structures and methods of manufacture and, more particularly, to methods, structures, and design structures for pixel sensor cells having anti-blooming characteristics.

BACKGROUND

CMOS image sensors are replacing conventional CCD sensors for applications requiring image pickup such as digital cameras, cellular phones, PDA (personal digital assistant), personal computers, and the like. Advantageously, CMOS image sensors are fabricated by applying present CMOS fabricating process for semiconductor devices such as photodiodes or the like, at low costs. Furthermore, CMOS image sensors can be operated by a single power supply so that the power consumption for that can be restrained lower than that of CCD sensors, and further, CMOS logic circuits and like logic processing devices are easily integrated in the sensor chip and therefore the CMOS image sensors can be miniaturized.

Most image sensors, such as pixel sensor cells, have a linear signal response to incoming incident photons until the light conversion/sensing element of the pixels becomes saturated and the image sensor signal reaches a maximum level. For example, FIG. 1 shows a pixel sensor cell response curve including a noise floor, a linear region and a saturated region. The linear region determines the dynamic range over which a pixel sensor cell can operate in a predictable manner. It is desirable for the pixel sensor cell to have a very large dynamic range, such that it is suitable in low light conditions as well as bright (e.g., sunny) conditions.

Typical image sensors handle varying light conditions by increasing or decreasing image sensor integration or shutter time to control the amount of the light signal collected by the sensor. This integration time and/or shutter time adjustment is done globally for the whole image sensor. When such image sensors are used to capture an image that has very large variations in light signal across the imager (such as, for example, outdoor images), portions of the image may be over-exposed or under-exposed impacting image resolution (e.g., very bright regions are washed out in white or very dark regions are washed out dark, thereby losing detail).

More specifically, blooming is a problem that may occur when integration time and/or shutter time adjustment is performed globally for the whole image sensor including thousands (or more) of individual sensors. Blooming occurs when the charge in a pixel exceeds a saturation level (e.g., enters the saturated region shown in FIG. 1) and the charge begins to migrate into adjacent pixels. For example, a pixel that reaches a saturation level does not stop generating electrons from incident photons; instead, the excess electrons that are generated post-saturation can make their way (e.g., bloom) into adjacent pixels. This blooming distorts that image data in the adjacent pixels since the adjacent pixels include charge that is not the result of photons impinging on the adjacent pixels.

Accordingly, there exists a need in the art to overcome the deficiencies and limitations described hereinabove.

SUMMARY

In a first aspect of the invention, there is a method of preventing blooming in a pixel array. The method includes affecting an amount of light that impinges on a photoelectric conversion element by adjusting a transmissivity of an electrochromic element based on an output of the photoelectric conversion element.

In another aspect of the invention, there is a pixel sensor cell comprising: a photoelectric conversion element; an electrochromic element arranged in a path that light travels to the photoelectric conversion element; and a feedback circuit. The feedback circuit is structured to adjust a transmissivity of the electrochromic element based on an output of the photoelectric conversion element.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a pixel sensor cell which comprises the structures of the present invention. In still further embodiments, a method in a computer-aided design system is provided for generating a functional design model of the pixel sensor cell. The method comprises generating a functional representation of the structural elements of the pixel sensor cell, which includes: a photoelectric conversion element; an electrochromic element arranged in a path that light travels to the photoelectric conversion element; and a feedback circuit that adjusts a transmissivity of the electrochromic element based on an output of the photoelectric conversion element.

In another aspect of the invention, there is a method of forming a pixel sensor cell. The method includes forming a photoelectric conversion element in an active region of a substrate. The method also includes forming a first transparent conductor over the substrate, forming an electrochromic material on the first transparent conductor, and forming a second transparent conductor on the electrochromic material. The first transparent conductor, electrochromic material, and second transparent conductor are over and substantially aligned with the photoelectric conversion element. The method further includes electrically connecting the first transparent conductor to a voltage source. The method also includes electrically connecting the second transparent conductor to a source of a source follower transistor associated with the photoelectric conversion element. A gate of the source follower transistor is electrically connected to a floating diffusion node that is connected to an output of the photoelectric conversion element.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
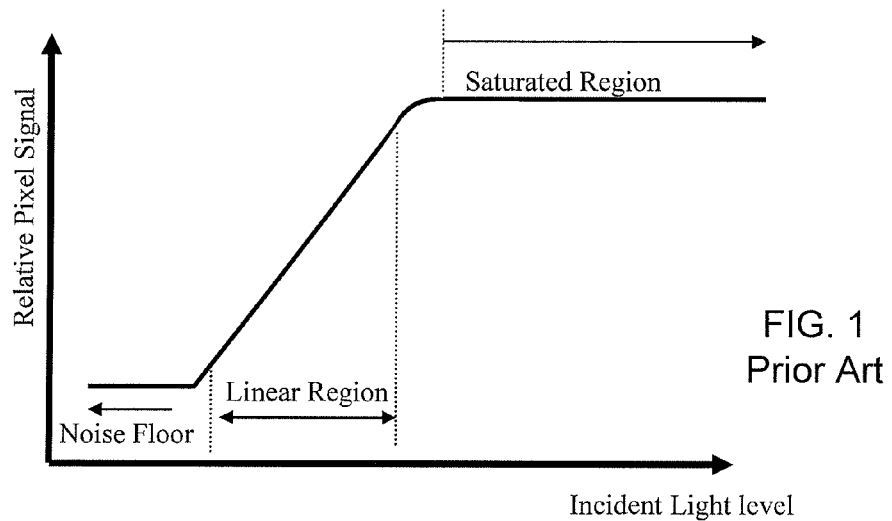
FIG. 1 depicts a pixel sensor cell response curve.

The invention relates to semiconductor structures and methods of manufacture and, more particularly, to methods, structures, and design structures for pixel sensor cells having anti-blooming characteristics. Aspects of the invention are related to a pixel sensor cell (e.g., image sensor, CMOS image sensor, infrared image sensor, etc.) comprising an in-pixel feedback circuit coupled to portions of the pixel sensor cell and an electrochromic film. In embodiments, the feedback circuit automatically provides for changing of the transmissivity of the electrochromic film depending on the amount of electromagnetic radiation (e.g., light) which is incident upon the pixel sensor cell. In embodiments, one electrode in contact with the electrochromic film is coupled to a power supply voltage (e.g., Vdd), and another electrode in contact with the electrochromic film is coupled to the output of a source follower (SF) transistor that is operatively connected to the light conversion/sensing element of the pixel sensor cell. In this manner, the transmissivity of the electrochromic film is controlled by the output of the light conversion/sensing element of the pixel sensor cell, which in turn depends on the amount of incident light. Embodiments of the invention may be implemented without an external control circuit to control the state of the electrochromic film, which permits implementations of the invention to be relatively small in size and manufactured with less fabrication steps.

In accordance with aspects of the invention, the structures of the pixel sensor cell, the feedback circuit, and the electrochromic film are configured such that the electrochromic film turns opaque at a point in the linear region of the response of the output of the light conversion/sensing element of the pixel sensor cell just prior to the saturation region. In this manner, saturation of a pixel sensor cell is avoided, which reduces or prevents blooming.

Embodiments of the invention may be implemented at any desired level of granularity with respect to the individual pixel sensor cells contained in an array of plural pixel sensor cells (e.g., in an image sensor). For example, a respective feedback circuit and electrochromic film may be provided for each respective pixel sensor cell in the image sensor. In this manner, each pixel sensor cell has its own anti-blooming mechanism. Additionally or alternatively, a respective feedback circuit and electrochromic film may be provided for any desired grouping of a plurality of pixel sensor cells in the image sensor. For example, a respective feedback circuit and electrochromic film may be provided for each respective row of pixel sensor cells. As another example, a respective feedback circuit and electrochromic film may be provided for respective clusters of pixel sensor cells, which clusters may be arranged in a tiled manner to encompass the entire image sensor.

Accordingly, implementations of the invention provide for locally attenuating the light incident onto the image sensor sensing elements at any desired level of granularity with respect to the individual pixels sensor cells. By way of example, as the local lux level increases, a filter element (e.g., the electrochromic film) decreases its transmissivity, thereby decreasing the overall light making it to the image sensing elements. This dynamic filtering may be performed at various locations in the optical path, including as the cover glass of the pixel sensor cell package, as a coating on the camera lens, for digital pixel sensor cells as one of the layers in the semiconductor stack, etc.

Figure 2:
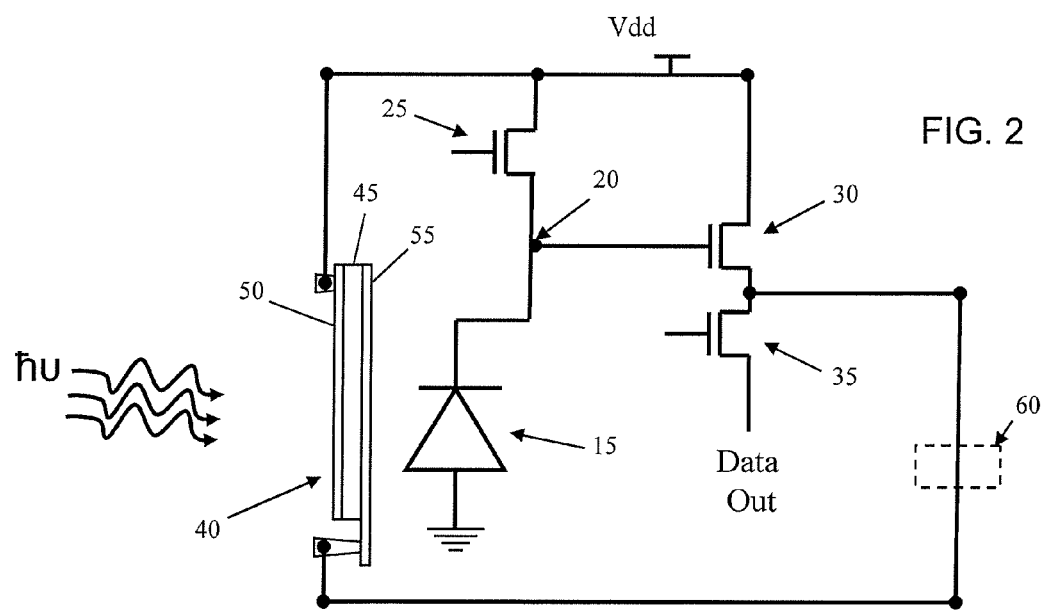
FIG. 2 depicts an anti-blooming feedback circuit associated with a pixel sensor cell in accordance with aspects of the invention.

FIG. 2 depicts an in-pixel feedback circuit implemented in a pixel sensor cell in accordance with aspects of the invention. In embodiments, the circuit is formed in a semiconductor structure (as described in greater detail herein) and includes a light conversion/sensing element such as a photodiode 15, a floating diffusion node 20, a reset gate (RG) transistor 25, a source follower (SF) transistor 30, and a row select (RS) transistor 35. The light conversion/sensing element may comprise any suitable photoelectric conversion element such as, but not limited to, a photodiode. In particular, the photodiode 15 may be a pinned photodiode set to a predetermined pinning potential. For example, the photodiode 15 may be a pinned photodiode comprising a shallow p-type pinning layer and a deeper n-type diffusion to create a buried channel with controlled potential, for example 1.5 v, for holding charge. Each of the RG transistor 25, SF transistor 30, and RS transistor 35 may comprise a field effect transistor (FET), which may be n-type (NFET) or p-type (PFET) transistors formed in an active region of a semiconductor chip.

In embodiments, one end of the photodiode 15 is grounded while the other end is connected to the FD node 20. The FD node 20 is connected to the source of the RG transistor 25 and also to the gate of the SF transistor 30. The drain of the RG transistor 25 and the drain of the SF transistor 30 are connected to the power supply source, e.g., Vdd. The source of the SF transistor 30 is connected to the drain of the RS transistor 35. The source of the RS transistor 35 is a data out node, e.g., the output node of the pixel sensor cell.

According to aspects of the invention, an electrochromic element 40 is provided between the incident light $\hbar v$ and the photodiode 15, e.g., the electrochromic element 40 is arranged in a path that light travels to the photodiode 15. In embodiments, the electrochromic element 40 comprises an electrochromic material 45 arranged between a first electrically conductive element 50 and a second electrically conductive element 55. The first conductive element 50 is coupled to Vdd and the second conductive element 55 is coupled to the source of the SF transistor 35. In accordance with aspects of the invention, the transmissivity of the electrochromic material 45 changes depending on the electric potential between the first conductive element 50 and the second conductive element 55, and this change in transmissivity affects how much light is incident upon the photodiode 15. The circuit depicted in FIG. 2 is an in-pixel feedback circuit because the output of the photodiode 15 affects the electric potential between the first conductive element 50 and the second conductive element 55, which affects the transmissivity of the electrochromic material 45. This, in turn, affects how much light incident light $\hbar v$ impinges upon the photodiode 15, which affects the output of the photodiode 15.

In operation, the RG transistor 25 is pulsed ON which resets the photodiode 15, sets the FD node 20 to Vdd, and sets the source of the SF transistor 30 to Vdd. Both the first conductive element 50 and the second conductive element 55 are at Vdd when the SF transistor 30 source is at Vdd. In this state there is substantially no (or very little) potential across the electrochromic material 45, such that the transmissivity of the electrochromic material 45 is at a highest value (e.g., most transmissive, least opaque).

In embodiments, the RG transistor 25 goes to OFF after the reset pulse. The FD node 20 is floating when the RG transistor 25 is OFF. When the RG transistor 25 is OFF, photons of incident light $\hbar v$ impinging on the photodiode 15 are converted to electrons, which pull down the voltage at the FD node 20. As the FD node 20 voltage drops, the SF transistor 30 source voltage also drops, which moves the voltage on the second conductive element 55 away from Vdd. The first conductive element 50 is held substantially at Vdd, such that the change of the voltage on the second conductive element 55 away from Vdd increases the potential across the electrochromic material 45. The increased potential across the electrochromic material 45 causes the electrochromic material 45 to change its transmissivity, e.g., become more opaque.

According to aspects of the invention, at a threshold electric potential across the electrochromic material 45, the electrochromic material 45 becomes totally opaque and blocks any further light from impinging on the photodiode 15. In embodiments, the threshold is defined (e.g., via materials and sizes of the photodiode 15, transistors 25, 30, 35, conductive elements 50, 55, and electrochromic material 45) at a point that is still within the linear region of the response curve of the pixel sensor cell, and just before the response curve transitions to the saturated region. In this manner, saturation of the photodiode 15 is prevented, which means that blooming is avoided. As such, the circuit provides a feedback circuit for attenuating the amount of light that is incident on the photodiode 15 in order to prevent blooming by avoiding a saturation state of the photodiode 15. Moreover, the feedback circuit is formed using components that are comprised in the pixel sensor cell, such that use of additional control circuitry that is external to the pixel sensor cell is avoided.

The embodiment of FIG. 2 is shown and described with respect to a three-transistor (3T) pixel. However, the invention is not limited to implementation with a 3T pixel but, rather, aspects of the invention may be used with pixels having other numbers of transistors including, but not limited to, four-transistor (4T), five-transistor (5T), seven-transistor (7T), etc.

As described above, the circuit of FIG. 2 may be used to variably attenuate the transmissivity of the electrochromic material 45 proportionally to the output of the photodiode 15. In alternative embodiments, additional logic elements 60 may optionally be provided between the SF transistor 30 source and the second conductive element 55 to control the electrochromic material 45 in a binary manner. In particular, the additional logic (e.g., one or more comparators, etc.) may be used to prevent the SF transistor 30 source voltage from reaching the second conductive element 55 until the threshold is achieved. In this manner, the electrochromic material 45 remains at its baseline state (e.g., the transmissivity of the electrochromic material 45 at a highest value) until the threshold is reached. When the threshold is achieved (e.g., a sufficient amount of photons have impinged upon the photodiode and been converted to electrons), the SF transistor 30 source voltage is applied to the second conductive plate 55, which causes the electrochromic material 45 to turn opaque. In this manner, the circuit may be configured to operate in a binary state in which the electrochromic material 45 is held in one of two states: the baseline state in which the electrochromic material 45 is most transmissive, and the opaque state in which the electrochromic material 45 is least transmissive.

In further embodiments, additional logic (which may also be represented by element 60) may be provided that: stores the integration time it takes for the feedback circuit to trigger the electrochromic material 45 of a pixel region; calculates the relative lux for the pixel from the time it took to saturate; and extrapolates the image based on calculated lux. For example, when the picture is output, post processing may be used to calculate the photon flux for a given pixel from the saturation rate, and extrapolate the incident light level that would have impinged on the photodiode had the electrochromic material 45 not turned opaque. This may be performed when the electrochromic material 45 is turned opaque prior to the pixel response going nonlinear (e.g., into the saturated region). In accordance with aspects of the invention, this allows the pixels in the low-light areas of the image to take longer exposures to gain sufficient information, and those pixels in high light areas can max out while extending the dynamic range beyond the regular linear saturation region by extrapolating beyond the saturation point.

Figure 3:
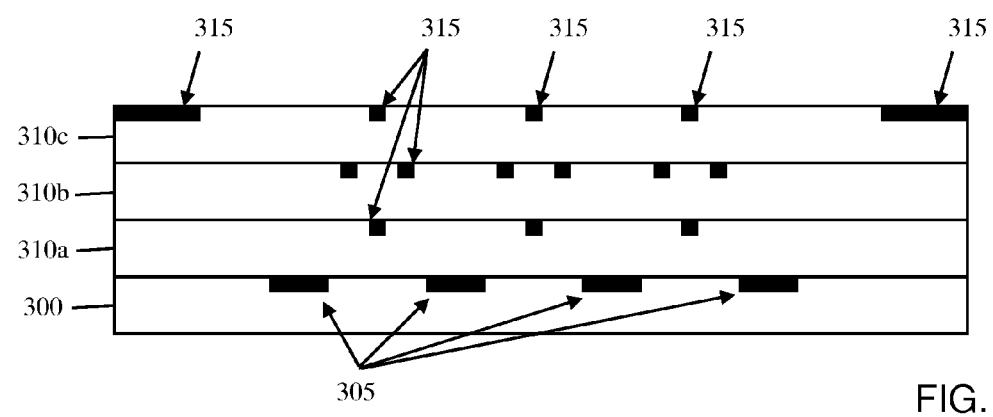
FIGS. 3-14 depict semiconductor structures and processing steps associated with aspects of the invention.

FIGS. 3-14 depict semiconductor structures and processing steps associated with aspects of the invention. More specifically, FIG. 3 shows an active region 300 of a semiconductor substrate in which an array of rows and columns of photoelectric conversion elements 305 are formed. Each one of the photoelectric conversion elements 305 may be similar to photodiode 15 described with respect to FIG. 2. Formed on the substrate is a stack of interlevel dielectric (ILD) layers 310a-c incorporating any suitable number and pattern of wires and/or interconnects 315 for electrically connecting components of the semiconductor structure. The ILD layers 310a-c may be composed of any suitable material including, but not limited to, $SiO_2$ or polymer. Although not shown in FIG. 3, a respective RG transistor 25, SF transistor 30, and RS transistor 35 may be formed in the substrate with each respective photoelectric conversion element 305 and operatively connected to the photoelectric conversion element 305 as described above with respect to FIG. 2.

Figure 4:
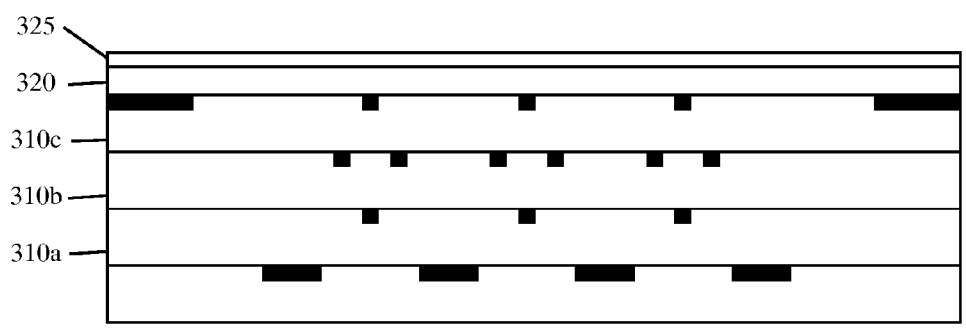

As depicted in FIG. 4, an upper ILD 320 is formed on the stack of ILD layers 310a-c, and a first transparent conductor 325 is formed on the upper ILD 320. In embodiments, the first transparent conductor 325 comprises an ITO (Indium-tin-oxide) film, or any other suitable transparent conductive material. The upper ILD 320 may be composed of the same material as the ILD layers 310a-c, e.g., $SiO_2$, polymer, etc.

Figure 5:
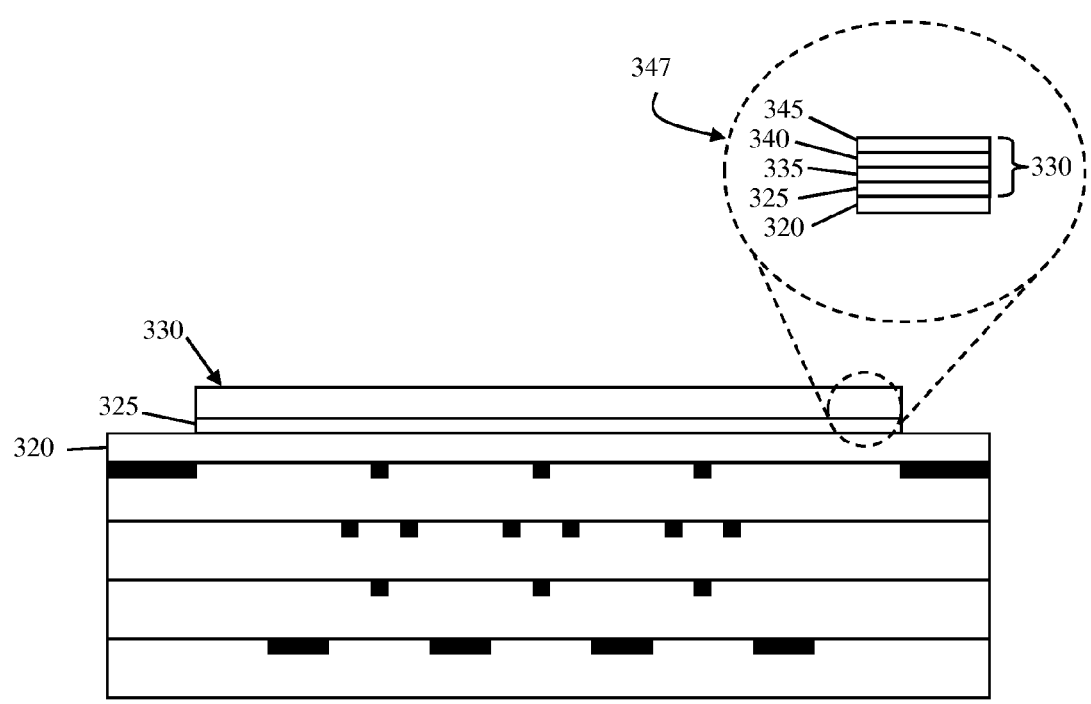

As depicted in FIG. 5, an electrochromic material 330 is formed on the first transparent conductor 325. In embodiments, the electrochromic material 330 comprises a stack of film layers including, for example, an ion storage layer 335 composed of $Li_{1.2}V_2O_5$, which may also be expressed as $Li_6V_{10}O_{25}$, an ion conductor layer 340 composed of $LiAlF_4$, and an electrochromic layer 345 composed of $WO_3$, as depicted in magnified area 347. The layers 335, 340, 345 may be formed in any suitable manner, such as chemical vapor deposition (CVD), sputtering, chemical solution deposition (sol-gel), etc. In embodiments, the electrochromic material 330 and the first transparent conductor 325 are patterned (e.g., using photolithography) as one-dimensional rows coinciding with rows of the photoelectric conversion elements 305. Any suitable patterning process may be used, including reactive ion etch (RIE) and wet etches. For example, the ITO may be etched using chlorine-based or fluorine-based RIE. The $WO_3$ may be etched using chlorine-based or fluorine-based RIE, or using $H_2O_2$-based wet etch. The $LiAlF_4$ may be etched using chlorine-based RIE or Argon sputter. The $Li_{1.2}V_2O_5$ may be etched using chlorine-based RIE.

Figure 6:
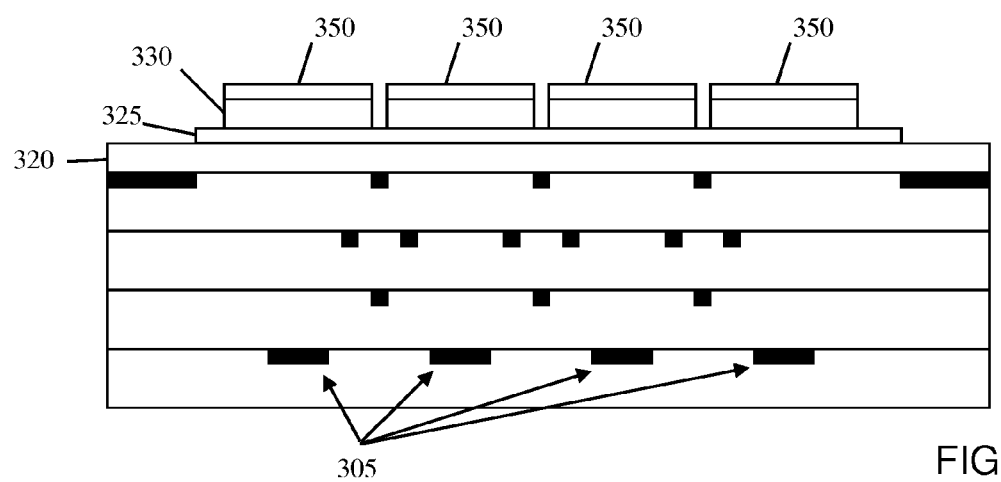

As depicted in FIG. 6, a second transparent conductor 350 is formed on the electrochromic material 330. The second transparent conductor 350 may comprise an ITO film, or any other suitable transparent conductive material. In embodiments, the electrochromic material 330 and the second transparent conductor 350 are patterned (e.g., using photolithography) into one-dimensional columns coinciding with columns of the photoelectric conversion elements 305.

According to aspects of the invention, by patterning the electrochromic material 330 along both columns and rows of the photoelectric conversion elements 305, a discrete respective portion of the electrochromic material 330 is provided above each respective one of the photoelectric conversion elements 305. Each discrete portion of the electrochromic material 330 may be used as the electrochromic material 45 in the circuit described above with respect to FIG. 2. The processing steps associated with FIGS. 5 and 6 also result in a discrete portion of the second transparent conductor 350 being provided above each respective one of the photoelectric conversion elements 305. Each discrete portion of the second transparent conductor 325 may be used as the second conductive element 55 in the circuit described above with respect to FIG. 2. Moreover, the first transparent conductor 350 may be used as the first conductive element 50 in the circuit described above with respect to FIG. 2.

Figure 7:
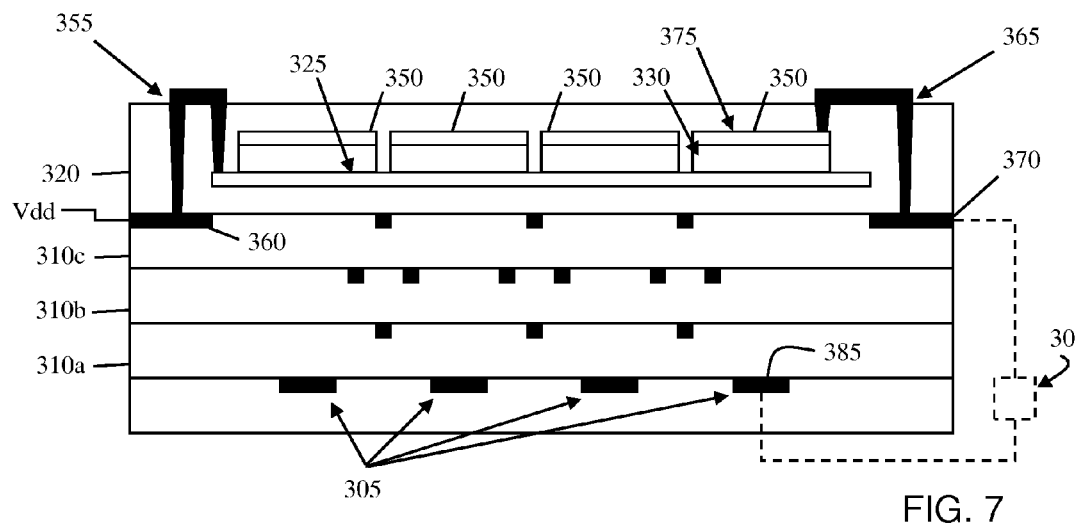

As depicted in FIG. 7, the upper ILD 320 is extended upward using CVD or any other suitable fabrication (e.g., deposition) process, such that the upper ILD 320 covers the first and second transparent conductors 325, 350 and the electrochromic material 330. In accordance with aspects of the invention, via and wire patterning is performed to complete electrical connections to appropriate wires in the ILD layers 310*a-c*. For example, vias and/or interconnects 355 may be formed in and/or on the upper ILD 320 to connect a first wire 360 to the first transparent conductor 325. In embodiments, the first wire 360 is coupled to Vdd, which results in the first transparent conductor 325 being tied to Vdd. Additionally, other vias/interconnects 365 may be formed in/on the upper ILD 320 to connect a second wire 370 to a second conductive plate 375 which comprises a discrete portion of the second transparent conductor 350. In embodiments, the second wire 370 is coupled to the source of the SF transistor (e.g., SF transistor 30) associated with a respective photoelectric conversion element 385 (e.g., one of the array of photoelectric conversion elements 305) aligned with the second conductive plate 375, as is diagrammatically shown in FIG. 7.

In accordance with aspects of the invention, the circuit depicted in FIG. 2 may be implemented in the structure shown in FIG. 7. In particular: the respective photoelectric conversion element 385 corresponds to the photodiode 15; the second conductive plate 375 corresponds to the second conductive element 55; the first transparent conductor 325 corresponds to the first conductive element 50; and a discrete portion of the electrochromic material 330 sandwiched between the second conductive plate 375 and the first transparent conductor 325 corresponds to the electrochromic material 45.

Figure 8:
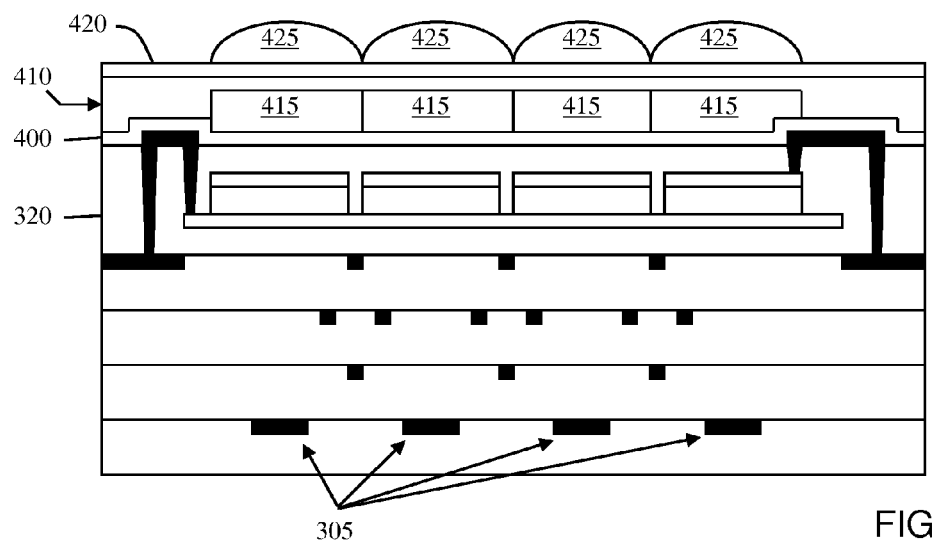

In accordance with aspects of the invention, processing continues with formation of a passivation layer 400 on the upper ILD 320 and any exposed interconnects, as shown in FIG. 8. The passivation layer 400 may comprise SiN, $SiO_2$, or combinations thereof. A color filter array 410 may be formed on the passivation layer 400 using conventional processing techniques. In embodiments, the color filter array 410 includes individual red, green, and blue filter elements 415 (e.g., primary color filter) or alternately, cyan, magenta, and yellow filter elements (e.g., complementary color filter). A planarization layer 420, e.g., a spin-on polymer, may be formed on the color filter array 410. In embodiments, a plurality of microlenses 425, each having a hemispherical shape, are formed on the planarization layer 420 using standard processing techniques. Each microlens 425 is aligned with a color filter element 415 and a respective one of the array of photoelectric conversion elements 305, and comprises an upper light receiving portion of a pixel.

In alternative embodiments of the invention, a photochromic material may be used instead of the above-described electrochromic material. Photochromic films change transmissivity levels in response to spectral radiation and do not require the application of an electric potential as with electrochromic materials. One example of photochromic material is a stack of nickel hydroxide ($Ni(OH)_2$) and titanium dioxide ($TiO_2$) films that changes its transmissivity when exposed to UV radiation, which is typically readily available in outdoor pictures in normal daylight. Other examples are silver chloride and silver halide films, which have photochromic behavior when exposed to UV light.

Figure 9:
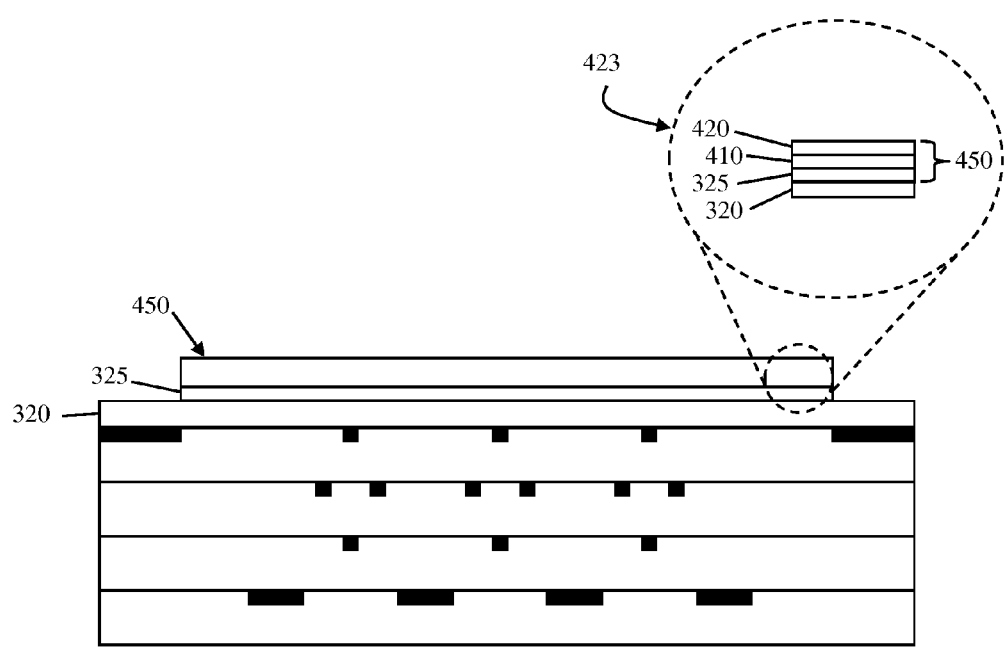

FIG. 9 shows a structure in which a photochromic film 450 has been formed on the structure of FIG. 4, and the photochromic film 450 and the first transparent conductor 325 have been patterned. In FIGS. 9-13, like reference numerals represent the same elements as described with respect to FIGS. 2-8. In embodiments, the photochromic film 450 comprises a stack of a nickel hydroxide ($Ni(OH)_2$) film 410 and a titanium dioxide ($TiO_2$) film 420 formed by CVD, sputtering, sol-gel, or any other suitable process, as depicted in magnified area 423. The invention is not limited to nickel hydroxide and titanium dioxide, however, and any suitable photochromic material may be used within the scope of the invention. In embodiments, the photochromic film 450 and the first transparent conductor 325 are patterned (e.g., using photolithography) as one-dimensional rows coinciding with rows of the photoelectric conversion elements 305.

Figure 10:
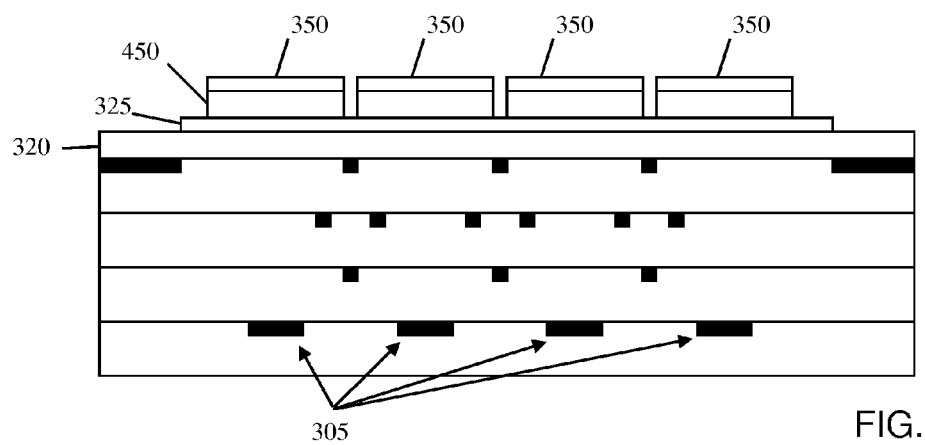

As depicted in FIG. 10, a second transparent conductor 350 is formed on the photochromic material 450. The second transparent conductor 350 may comprise an ITO film, or any other suitable transparent conductive material. In embodiments, the photochromic material 450 and the second transparent conductor 350 are patterned (e.g., using photolithography) into one-dimensional columns coinciding with columns of the photoelectric conversion elements 305. According to aspects of the invention, by patterning the photochromic material 450 along both columns and rows of the photoelectric conversion elements 305, a discrete respective portion of the photochromic material 450 is provided above each respective one of the photoelectric conversion elements 305.

Figure 11:
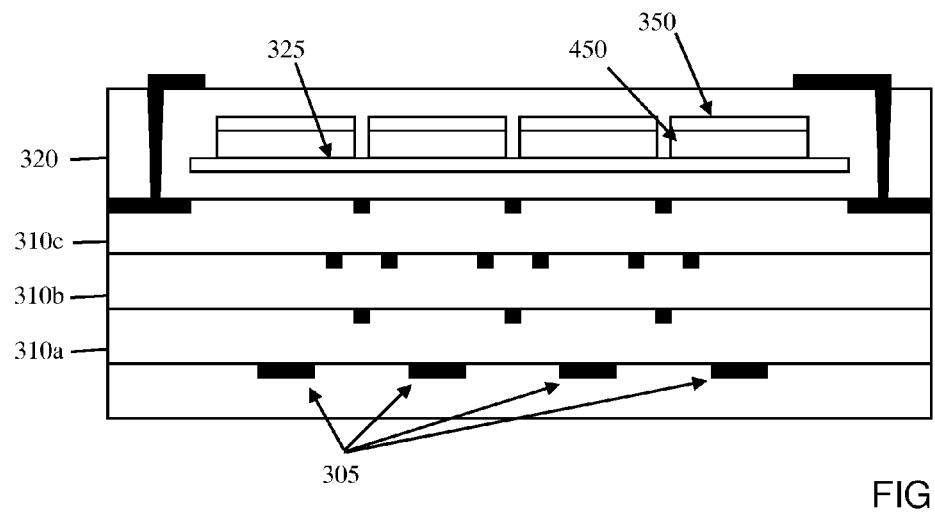

As depicted in FIG. 11, the upper ILD 320 is extended upward using CVD or any other suitable fabrication process, such that the upper ILD 320 covers the first and second transparent conductors 325, 350 and the photochromic material 450. In accordance with aspects of the invention, via and wire patterning is performed to complete electrical connections to appropriate wires in the ILD layers 310*a-c*.

Figure 12:
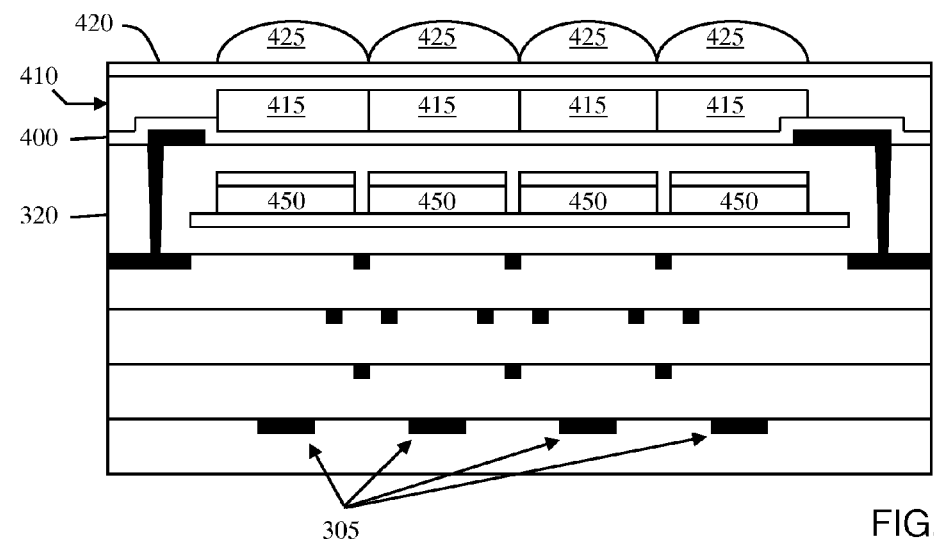

In accordance with aspects of the invention, processing continues with formation of a passivation layer 400 on the upper ILD 320 and any exposed interconnects, as shown in FIG. 12. The passivation layer 400 may comprise SiN, $SiO_2$, or combinations thereof. A color filter array 410 may be formed on the passivation layer using conventional processing techniques. In embodiments, the color filter array 410 includes individual red, green, and blue filter elements 415 (e.g., primary color filter) or alternately, cyan, magenta, and yellow filter elements (e.g., complementary color filter). A planarization layer 420, e.g., a spin-on polymer, may be formed on the color filter array 410. In embodiments, a plurality of microlenses 425, each having a hemispherical shape, are formed on the planarization layer 420 using standard processing techniques. Each microlens 425 is aligned with a color filter element 415, a portion of photochromic film 450, and a respective one of the array of photoelectric conversion elements 305, and comprises an upper light receiving portion of a pixel.

Figure 13:
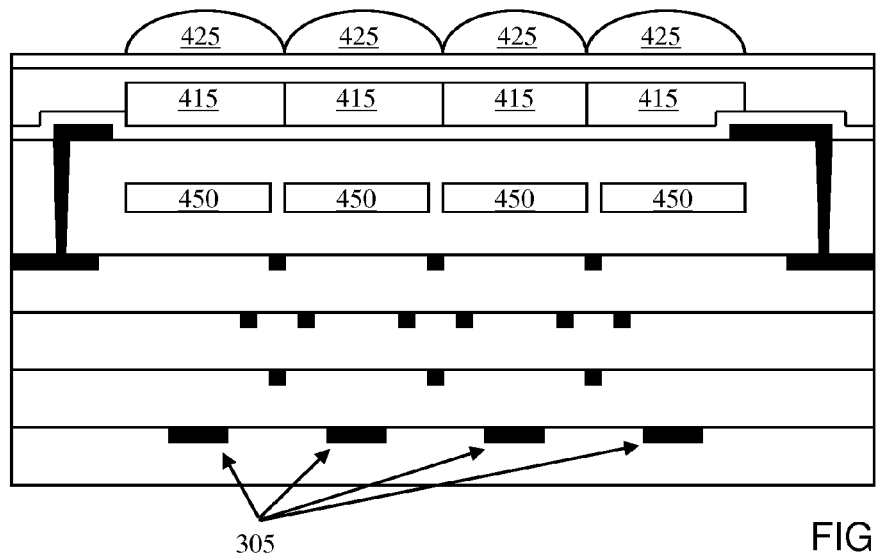

FIG. 13 shows an embodiment comprising photochromic material 450 but without the first and second transparent conductors 325 and 350. Since the photochromic material 450 does not require being driven by an electric potential to change its transmissivity, the formation of the first and second transparent conductors 325 and 350 may be omitted.

The embodiments shown thus far depict the chromic materials (e.g., the electrochromic material 330 and photochromic material 450) in an upper ILD 320. The invention is not limited to this location for the chromic materials, however, and the chromic materials may be arranged at any location with the pixel stack. For example, the chromic materials may be formed in any of the ILD layers 310a-c. As another example, the chromic materials may be formed after (e.g., above) the color filter array. Moreover, embodiments of the invention may be implemented at any desired level of granularity with respect to the individual pixel sensor cells contained in an array of pixel sensor cells. For example, a respective chromic material (e.g., 330 or 450) may be provided for each respective pixel sensor cell in the image sensor. Additionally or alternatively, a respective chromic material (e.g., 330 or 450) may be provided for any desired grouping of a plurality of pixel sensor cells in the image sensor. For example, a respective chromic material (e.g., 330 or 450) may be provided for each respective row of pixel sensor cells. As another example, a respective chromic material (e.g., 330 or 450) may be provided for respective groupings of pixel sensor cells, which groupings may be arranged in any desired geometric pattern to encompass some, or all, of the entire image sensor pixel array. When a feedback circuit and electrochromic element are used with more than one photodiode (e.g., one circuit and electrochromic element are used with a plurality of photodiodes), additional logic can added to use the highest output of a single photodiode of the plurality of photodiodes as the voltage for the second conductive element contacting the electrochromic material.

Figure 14:
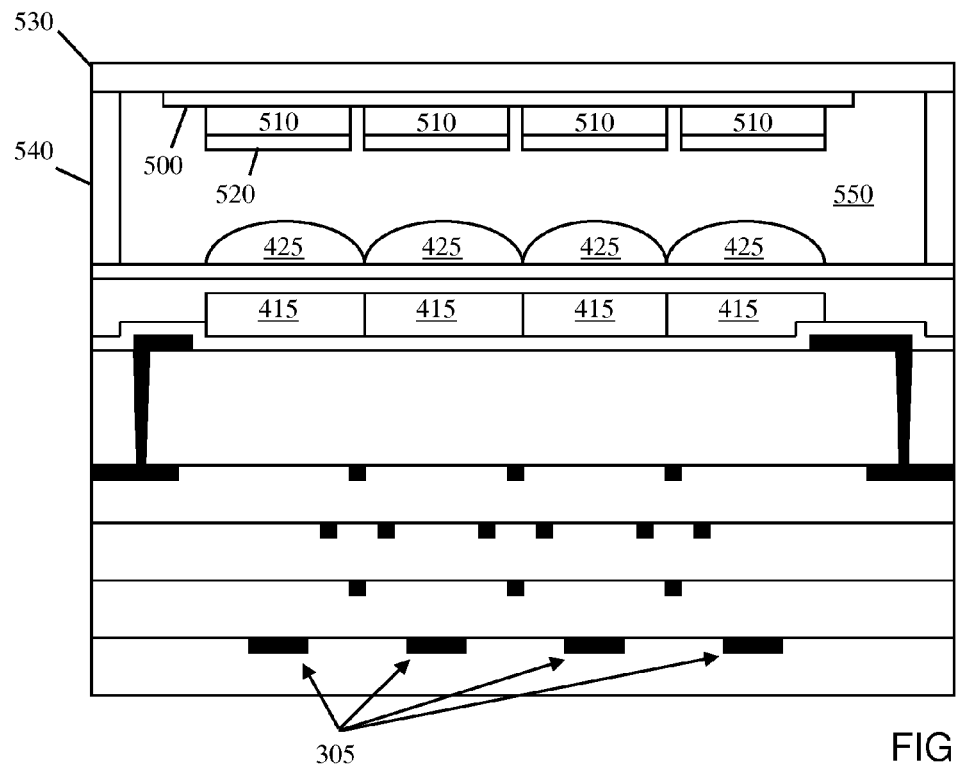

In a particular embodiment shown in FIG. 14, the chromic material is comprised in an independent component above the imager array rather than being integrated into the layers of the substrate. More specifically, a first transparent conductor 500, a chromic material 510, and a second transparent conductor 520 are formed on a glass lid 530 that is connected above the package by spacers 540 composed of a patterned polymer layer. In embodiments, an air gap 550 is present between the glass lid 530 and the package.

Figure 15:
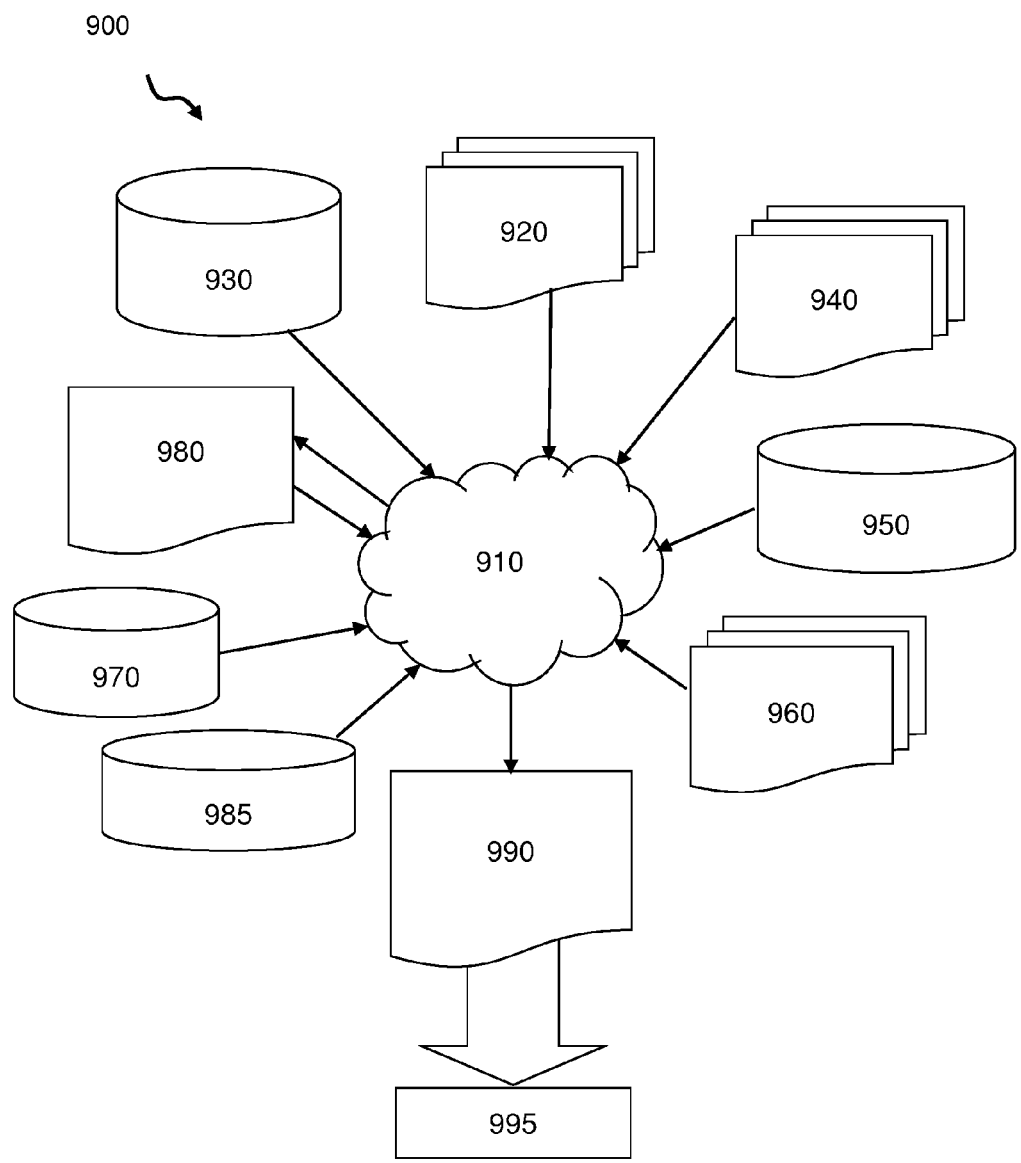
FIG. 15 is a flow diagram of a design process used in semiconductor design, manufacture, and/or test.

FIG. 15 is a flow diagram of a design process used in semiconductor design, manufacture, and/or test. FIG. 15 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 2-14. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2-14. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2-14 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-14. In one embodiment, design structure 990 may comprise a compiled, executable HDL simulation model that functionally simulates the devices shown in FIGS. 2-14.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2-14. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of preventing blooming in a pixel array, comprising:
    affecting an amount of light that impinges on a photoelectric conversion element by adjusting a transmissivity of an electrochromic element based on an output of the photoelectric conversion element, wherein the adjusting the transmissivity of the electrochromic element comprises turning the electrochromic element opaque prior to the photoelectric conversion element becoming saturated.

2. The method of claim 1, wherein the adjusting the transmissivity comprises creating an electric potential across an electrochromic material between first and second electrically conductive elements.

3. The method of claim 2, wherein the creating the electric potential comprises:
    holding the first electrically conductive element at a reference voltage; and
    changing a voltage of the second electrically conductive element away from the reference voltage based on the output of the photoelectric conversion element.

4. The method of claim 3, wherein the changing the voltage of the second electrically conductive element comprises setting the voltage of the second electrically conductive element to a voltage of a source of a source follower transistor.

5. The method of claim 4, further comprising:
    coupling a gate of the source follower transistor to the output of the photoelectric conversion element; and
    coupling a drain of the source follower transistor to the reference voltage.

6. The method of claim 1, further comprising affecting an amount of light that impinges on a second photoelectric conversion element by adjusting a transmissivity of a second electrochromic element based on an output of the second photoelectric conversion element, wherein the photoelectric conversion element and the second photoelectric conversion element are comprised in the pixel array in an image sensor.

7. A pixel sensor cell, comprising:
a photoelectric conversion element;
an electrochromic element arranged in a path that light travels to the photoelectric conversion element; and
a feedback circuit that is structured to adjust a transmissivity of the electrochromic element based on an output of the photoelectric conversion element,
wherein the electrochromic element comprises an electrochromic material contacting a first electrically conductive element and a second electrically conductive element;
the first electrically conductive element is electrically coupled to a reference voltage; and
the second electrically conductive element is electrically coupled to a source voltage of a source follower transistor.

8. The pixel sensor cell of claim 7, wherein:
a gate of the source follower transistor is electrically coupled to an output of the photoelectric conversion element; and
a drain of the source follower transistor is electrically coupled to the reference voltage.

9. The pixel sensor cell of claim 7, wherein the photoelectric conversion element comprises a pinned photodiode.

10. The pixel sensor cell of claim 7, wherein the feedback circuit is structured to adjust the transmissivity of the electrochromic element in a manner proportional to the output of the photoelectric conversion element.

11. The pixel sensor cell of claim 7, wherein the feedback circuit is structured to adjust the transmissivity of the electrochromic element in a binary manner between first and second states based upon a predefined threshold.

12. The pixel sensor cell of claim 7, further comprising:
a second pixel sensor cell comprising a second photoelectric conversion element;
a second electrochromic element arranged in a path that light travels to the second photoelectric conversion element; and
a second feedback circuit that adjusts a transmissivity of the second electrochromic element based on an output of the second photoelectric conversion element.

13. The pixel sensor cell of claim 12, wherein the pixel sensor cell and the second pixel sensor cell are comprised in an array in an image sensor.

14. The pixel sensor cell of claim 7, further comprising logic between the source voltage of the source follower transistor and the second electrically conductive element of the electrochromic element, wherein the logic is configured to control the electrochromic element in a binary manner by preventing the source voltage of the source follower transistor from reaching the second electrically conductive element until a threshold is achieved.

15. The pixel sensor cell of claim 7, further comprising logic that is configured to:
store an integration time to trigger the electrochromic element;
calculate a relative lux for a pixel region; and
extrapolate an image based on the calculated relative lux.

16. The pixel sensor cell of claim 7, further comprising:
the source follower transistor;
a reset gate transistor; and
a row select transistor;
wherein:
the photoelectric conversion element comprises a photodiode;
one end of the photodiode is grounded;
another end of the photodiode is connected to a floating diffusion node;
a source of the reset gate transistor is connected to the floating diffusion node;
a drain of the reset gate transistor is connected to the reference voltage;
a gate of the source follower transistor is connected to the floating diffusion node;
a drain of the source follower transistor is connected to the reference voltage;
a source of the source follower transistor is connected to a drain of the row select transistor; and
a source of the row select transistor is connected to an output node of the pixel sensor cell.

17. A hardware description language (HDL) design structure encoded on a machine-readable data storage medium, said HDL design structure comprising elements that when processed in a computer-aided design system generates a machine-executable representation of a pixel sensor cell, wherein said pixel sensor cell comprises:
a photoelectric conversion element;
an electrochromic element arranged in a path that light travels to the photoelectric conversion element; and
a feedback circuit that adjusts a transmissivity of the electrochromic element based on an output of the photoelectric conversion element,
wherein the electrochromic element comprises an electrochromic material contacting a first electrically conductive element and a second electrically conductive element;
the first electrically conductive element is electrically coupled to a reference voltage; and
the second electrically conductive element is electrically coupled to a source voltage of a source follower transistor.

18. The design structure of claim 17, wherein the design structure comprises a netlist.

19. The design structure of claim 17, wherein the design structure resides on storage medium as a data format used for the exchange of layout data of integrated circuits.

20. The design structure of claim 17, wherein the design structure resides in a programmable gate array.

* * * * *